(12) United States Patent
Khor et al.

(10) Patent No.: US 9,935,039 B2
(45) Date of Patent: Apr. 3, 2018

(54) PRE-MOLDED INTEGRATED CIRCUIT PACKAGES

(71) Applicant: Carsem (M) SDN. BHD., Ipoh (MY)

(72) Inventors: Lily Khor, Ipoh (MY); Lynn Simporios Guirit, San Pedro (PH)

(73) Assignee: Carsem (M) SDN. BHD., Ipoh (MY)

( * ) Notice: Subject to any disclaimer, the term of this patent is extended or adjusted under 35 U.S.C. 154(b) by 45 days.

(21) Appl. No.: 14/536,962

(22) Filed: Nov. 10, 2014

(65) Prior Publication Data

US 2015/0179553 A1    Jun. 25, 2015

(30) Foreign Application Priority Data

Dec. 10, 2013 (MY) .............................. 2013702407

(51) Int. Cl.
| | |
|---|---|
| *H01L 23/495* | (2006.01) |
| *H01L 23/31* | (2006.01) |
| *H01L 21/48* | (2006.01) |
| *H01L 23/24* | (2006.01) |
| *H01L 21/56* | (2006.01) |
| *H01L 23/00* | (2006.01) |

(52) U.S. Cl.
CPC .... *H01L 23/49513* (2013.01); *H01L 21/4821* (2013.01); *H01L 23/24* (2013.01); *H01L 23/315* (2013.01); *H01L 23/3157* (2013.01); *H01L 23/49503* (2013.01); *H01L 23/49541* (2013.01); *H01L 23/49548* (2013.01); *H01L 23/49565* (2013.01); *H01L 24/97* (2013.01); *H01L 21/56* (2013.01); *H01L 23/3107* (2013.01); *H01L 24/48* (2013.01); *H01L 24/85* (2013.01); *H01L 2224/48091* (2013.01); *H01L 2224/48247* (2013.01); *H01L 2924/00014* (2013.01); *H01L 2924/181* (2013.01)

(58) Field of Classification Search
CPC .......... H01L 23/49513; H01L 23/3192; H01L 23/3157; H01L 23/315; H01L 23/3135
See application file for complete search history.

(56) References Cited

U.S. PATENT DOCUMENTS

| | | | | |
|---|---|---|---|---|
| 5,070,041 | A | * | 12/1991 | Katayama ........... H01L 21/4835 257/702 |
| 5,338,972 | A | | 8/1994 | Negoro |
| 5,343,076 | A | * | 8/1994 | Katayama ............. H01L 23/057 257/690 |

(Continued)

*Primary Examiner* — Zandra Smith
*Assistant Examiner* — Abbigale Boyle
(74) *Attorney, Agent, or Firm* — Kilpatrick Townsend & Stockton LLP

(57) ABSTRACT

A leadframe with pre-molded cavities includes an outer frame and a plurality of units. Each unit includes a die pad and a plurality of leads. For each unit, a molding compound extends over a first portion of an upper surface of each of the leads that is located farthest from the die pad. The molding compound may also extend over an upper surface of the die pad. A second portion of the upper surface of each of the plurality of leads that is located nearest the die pad remains exposed outside the molding compound. A thickness of the molding compound covering the first portion of the upper surface of each of the leads is greater than a thickness of the molding compound covering the upper surface of the die pad.

10 Claims, 6 Drawing Sheets

(56) References Cited

U.S. PATENT DOCUMENTS

| | | | |
|---|---|---|---|
| 5,436,492 A * | 7/1995 | Yamanaka | H01L 21/50 |
| | | | 257/433 |
| 5,529,959 A * | 6/1996 | Yamanaka | H01L 21/50 |
| | | | 257/E21.499 |
| 5,701,034 A | 12/1997 | Marrs | |
| 5,722,161 A | 3/1998 | Marrs | |
| 5,793,100 A | 8/1998 | Takahashi | |
| 5,886,397 A | 3/1999 | Ewer | |
| 6,146,924 A | 11/2000 | Chang et al. | |
| 6,197,615 B1 * | 3/2001 | Song | H01L 23/49503 |
| | | | 257/E23.037 |
| 6,215,177 B1 | 4/2001 | Corisis et al. | |
| 6,229,200 B1 | 5/2001 | McLellan et al. | |
| 6,306,684 B1 | 10/2001 | Richardson et al. | |
| 6,384,472 B1 * | 5/2002 | Huang | H01L 21/50 |
| | | | 257/676 |
| 6,401,545 B1 | 6/2002 | Monk et al. | |
| 6,433,277 B1 | 8/2002 | Glenn | |
| 6,435,414 B1 * | 8/2002 | Zafrany | G06K 19/07743 |
| | | | 235/487 |
| 6,448,633 B1 | 9/2002 | Yee et al. | |
| 6,483,177 B1 | 11/2002 | Yee | |
| 6,563,201 B1 | 5/2003 | Golz | |
| 6,849,930 B2 | 2/2005 | Nakajima et al. | |
| 6,867,483 B2 | 3/2005 | Huat et al. | |
| 7,273,767 B2 * | 9/2007 | Ong | G01L 19/141 |
| | | | 257/E23.046 |
| 7,732,937 B2 | 6/2010 | Goller et al. | |
| 7,944,062 B2 | 5/2011 | Groenhuis et al. | |
| 7,989,933 B1 * | 8/2011 | Kim | H01L 23/49503 |
| | | | 257/676 |
| 8,071,427 B2 | 12/2011 | Celaya et al. | |
| 8,432,023 B1 | 4/2013 | Kim et al. | |
| 8,460,970 B1 | 6/2013 | Sirinorakul | |
| 2004/0084757 A1 * | 5/2004 | Seo | H01L 21/4828 |
| | | | 257/672 |
| 2005/0133878 A1 * | 6/2005 | Huang | H01L 27/14618 |
| | | | 257/433 |
| 2007/0001278 A1 * | 1/2007 | Jeon | H01L 23/49558 |
| | | | 257/676 |
| 2007/0108561 A1 * | 5/2007 | Webster | H01L 27/14618 |
| | | | 257/666 |
| 2007/0170559 A1 * | 7/2007 | Camacho | H01L 23/4951 |
| | | | 257/676 |
| 2009/0224382 A1 | 9/2009 | Goller et al. | |
| 2010/0117205 A1 * | 5/2010 | Do | H01L 23/3107 |
| | | | 257/670 |
| 2011/0263077 A1 | 10/2011 | Bai et al. | |
| 2013/0099366 A1 | 4/2013 | Cruz | |

* cited by examiner

PRE-MOLDED INTEGRATED CIRCUIT PACKAGES

CROSS-REFERENCES TO RELATED APPLICATIONS

This application claims priority to Malaysian Patent Application No. PI 2013702407, filed Dec. 10, 2013, the entire contents of which are incorporated herein by reference for all purposes.

FIELD OF THE INVENTION

Embodiments described herein relate in general to integrated circuit (IC) packages and, more particularly, to leadframes with pre-molded cavities for use in making IC packages and methods for forming pre-molded IC cavities.

BACKGROUND

Many IC packages used for sensor applications include sensitive devices such as microelectromechanical systems (MEMS). Because of their sensitivity, these devices are generally not encapsulated using conventional molding techniques. Instead, a pre-molded cavity is typically formed on a substrate (e.g., a leadframe, laminate substrate, ceramic substrate, or the like). The pre-molded cavity may be formed using an insert. The insert defines the cavity, and the molded portions form a wall or protective barrier surrounding the cavity. Portions of the leads and die pad are exposed in a center of the cavity. The devices can be coupled to the die pad and bonded to the leads within the cavity. They can then be covered with a protective gel encapsulant.

Conventional processes for forming IC packages with pre-molded cavities suffer from a number of quality issues. Thus, improvements are continuously sought to improve reliability of these IC packages.

SUMMARY

Some embodiments described herein provide IC packages having improved reliability. For example, in accordance with an embodiment, a leadframe with pre-molded cavities for use in making IC packages includes an outer frame and a plurality of units arranged within the outer frame. Each unit includes a die pad and a plurality of leads, where the die pad is located near a center of the unit and the plurality of leads are located around the die pad. For each unit, a molding compound extends over a first portion of an upper surface of each of the plurality of leads that is located farthest from the die pad and an upper surface of the die pad. A second portion of the upper surface of each of the plurality of leads that is located nearest the die pad remains exposed outside the molding compound. A thickness of the molding compound covering the portion of the upper surface of each of the plurality of leads is greater than a thickness of the molding compound covering the upper surface of the die pad.

Another embodiment provides a method of forming a pre-molded cavity over a die pad that is surrounded by a plurality of leads, where an upper surface of each of the plurality of leads has a closest portion that is nearest the die pad, a farthest portion that is farthest from the die pad, and a middle portion that is between the closest and farthest portions. An insert is placed over each of the plurality of leads. The insert has a bottom surface that contacts the closest portion of the upper surface of each of the plurality of leads. The insert also has a cutout above the middle portion of the upper surface of each of the plurality of leads so that the insert does not contact the middle portion of the upper surface. A first molded portion is formed that extends over the farthest portion of the upper surface of each of the plurality of leads. The first molded portion surrounds the die pad to form the cavity over the die pad. The insert prevents formation of the first molded portion over the closest and middle portions of the upper surface of each of the plurality of leads. The insert is removed to expose the closest and middle portions of the upper surface of each of the plurality of leads.

In accordance with another embodiment, a leadframe for use in making integrated circuit packages includes an outer frame, a plurality of units arranged within the outer frame, and a plurality of connecting bars. Each unit includes a die pad and a plurality of leads, where the die pad is located near a center of the unit and the plurality of leads are located around the die pad. Each connecting bar separates a unit from an adjacent unit. Each connecting bar includes a substantially planar upper surface with a plurality of dimples extending into the connecting bar from the substantially planar upper surface to a depth less than a thickness of the connecting bar. Each dimple is spaced from an adjacent dimple and from edges of the connecting bar by portions of the substantially planar upper surface.

Numerous benefits may be realized using embodiments described herein over conventional techniques. For example, in some embodiments a pre-molded IC package is formed using an insert that does not contact portions of the leads. This helps prevent the un-contacted surface from becoming damaged so that bonding wires can be reliably attached to the un-contacted surface. In other embodiments, a molding compound is formed over a die pad of a pre-molded IC package to secure the die pad to the package. This can prevent the die pad from becoming dislodged from the package. Depending on the embodiment, one or more of these benefits may exist. These and other embodiments, along with many other advantages and features, are described throughout the specification.

DETAILED DESCRIPTION

Embodiments described herein can improve reliability of IC packages. For example, in an embodiment a molding compound may be formed that encompasses a die pad (except for a bottom side) of a pre-molded IC package to secure the die pad to the package. This can prevent the die pad from becoming dislodged or separated from the package.

In another embodiment, a pre-molded IC package may be formed using an insert that does not contact portions of the leads. This can prevent the un-contacted portions of the leads from being scratched or the metal plating on these portions from being damaged. This allows bonding wires to be reliably attached to the un-contacted portions of the leads.

In another embodiment, dimples may be formed on connecting bars of a leadframe. The dimples can improve adhesion between the leadframe and molded portions (e.g., pre-molded portions) formed on the leadframe to prevent separation during singulation. This can prevent damage to the IC packages and the saw blade may occur if the leadrame and molded portions become separated during singulation.

It should be appreciated that the IC packages shown in the figures and described below are used merely as examples and that the methods and structures described herein may be applied to a number of different types of semiconductor packages. These include any type of leadrame package such as quad-flat no-leads (QFN) packages, dual-flat no-leads (DFN) packages, micro leadframe packages (MLPs), and the like. Also, the various features shown in the figures are not intended to be drawn so scale, and certain features may be exaggerated in some instances to highlight particular aspects.

Figure 1:
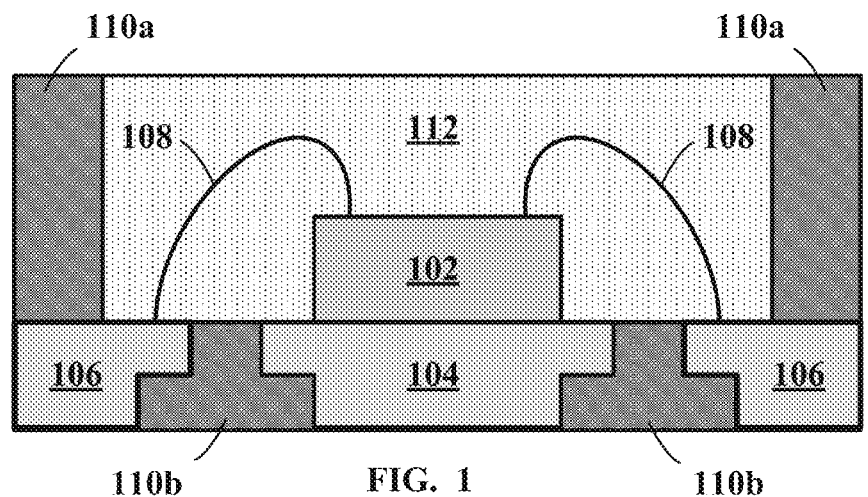
FIG. 1 is a simplified cross-sectional view of a pre-molded IC package in accordance with an embodiment.

FIG. 1 is a simplified cross-sectional view of a pre-molded IC package in accordance with an embodiment. A molding compound 110a extends over portions of leads 106 that are located farthest from die pad 104. The molding compound 110a forms a cavity over the die pad 104. Other portions 110b of the molding compound fill spaces between the leads 106 and the die pad 104. A semiconductor die 102 is coupled to the die pad 104 (e.g., using an adhesive). Bond pads (not shown) on an upper surface of the semiconductor die 102 are bonded to the leads 106 using bonding wires 108. A gel encapsulant 112 covers the semiconductor die 102 and fills at least a portion of the cavity over the die pad 104. Bottom surfaces of the die pad 104 and leads 106 may be exposed along a bottom of the IC package, and edges of the leads 106 farthest from the die pad 104 may be exposed along sides of the IC package. Although not shown in this example, in some embodiments portions of the leads may extend outward from the sides of the IC package.

Figure 2A:
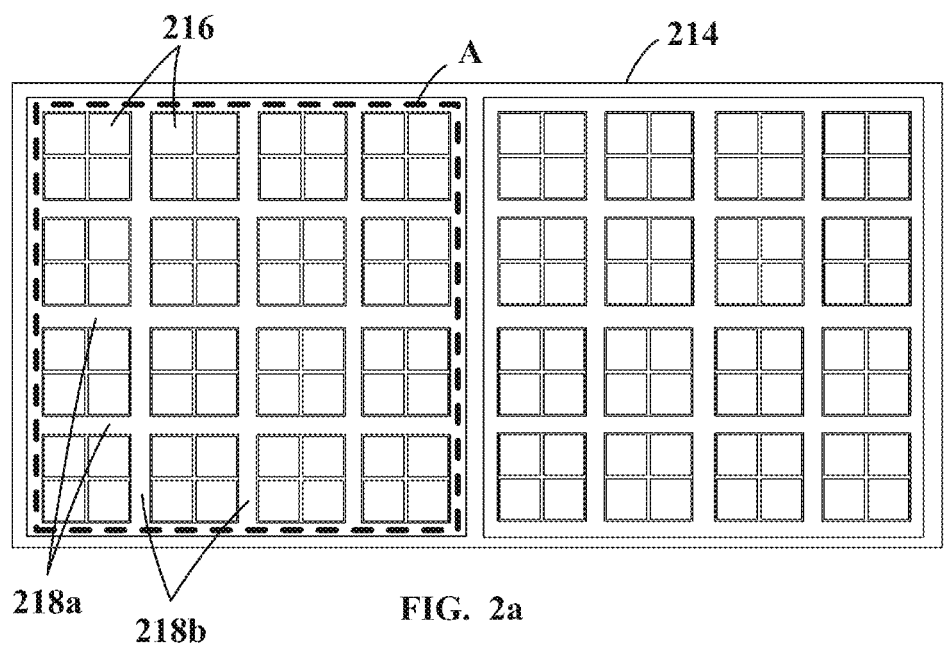
FIG. 2a-2c are simplified plan views of portions of a leadframe in accordance with some embodiments.

The pre-molded IC package shown in FIG. 1 is typically one of many IC packages that are assembled on a leadframe. The leadframe is attached to the leads and die pad of each package and supports them during the packaging processes. A singulation (or sawing) process is used to separate the individual IC packages from the leadframe. An exemplary leadframe (or portion of a leadframe) is shown in FIG. 2a. The leadframe includes a plurality of units 216 arranged in a matrix pattern within an outer frame 214. In this example, the units 216 are arranged in columns and rows, although some leadframes may include a single row of units 216 arranged side-by-side that are attached to the outer frame 214 at each end. The leadframe also includes horizontal connecting bars 218a and vertical connecting bars 218b that separate adjacent units 216. The leads and die pad of each unit (not shown in FIG. 2) are attached to the connecting bars 218a, 218b of the leadframe. The connecting bars 218a, 218b are non-active regions of the leadframe that support the die pads and leads during packaging processes but are not part of the final IC packages.

Figure 2B:
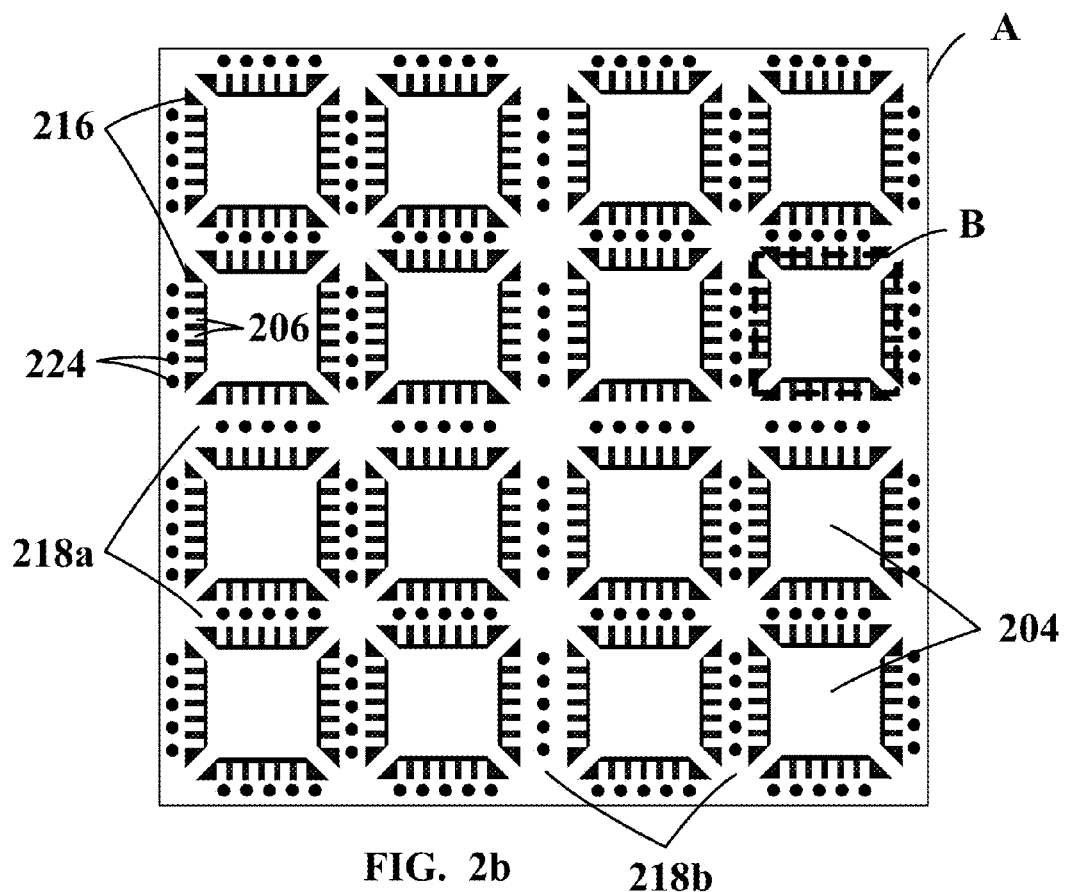

FIG. 2b is an enlarged view of the portion A of the leadframe that is outlined by dashed lines in FIG. 2a. This enlarged view shows that each of the plurality of units 216 include a die pad 204 near a center of the unit 216 and a plurality of leads 206 surrounding the die pad 204. This view also shows that the leads 206 and the die pad 204 of each unit are attached to the connecting bars 218a, 218b. Within each unit, the leads 206 extend outward from the connecting bars 218a, 218b toward the die pad 204. Each die pad 204 is attached to the connecting bars 218a, 218b by tie bars that extend from each corner of the die pad 204.

This example also includes dimples 224 disposed on an upper surface of the connecting bars 218a, 218b. The outer frame also includes dimples 224 on those portions that are adjacent to one of the units 216. The dimples 224 are depressions that in some cases have a bottom surface that is rougher than surrounding surfaces. The dimples 224 are shown as being circular-shaped although they are not limited to any particular shape, size, or depth. The dimples are also not limited to any particular number, spacing, density, pattern, or location on the leadframe. In an embodiment, the dimples 224 may be arranged in a periodic pattern along a middle of each of the connecting bars 218a, 218b. The connecting bars 218a, 218b may have a substantially planar upper surface, and the dimples 224 may extend into the connecting bars 218a, 218b to a depth less than a thickness of the connecting bars 218a, 218b. Each dimple 224 may be spaced from an adjacent dimple 224 and from edges of the connecting bars 218a, 218b by portions of the substantially planar upper surface. The dimples 224 may be formed using known masking and wet or dry etching techniques. Alternatively, the dimples may be formed by stamping or any other process that creates a small recess and/or removes a small divot from the surface of the leadframe.

In either case, the dimples 224 increase adhesion between the leadframe and an overlying molding compound (e.g., the molding compound used to form pre-molded cavities, or an encapsulant that is formed over IC packages that do not included pre-molded cavities). The molding compound fills the dimples 224 to create anchor-like features that hold the molding compound to the leadframe. The improved adhesion can reduce damage caused during singulation. During singulation an impact from the sawing process can cause the molding compound to separate from the leadframe. If the molding compound separates from the leadframe it can fly off and hit the leadframe and/or the saw blade causing damage. The improved adhesion reduces the likelihood of separation.

Figure 2C:
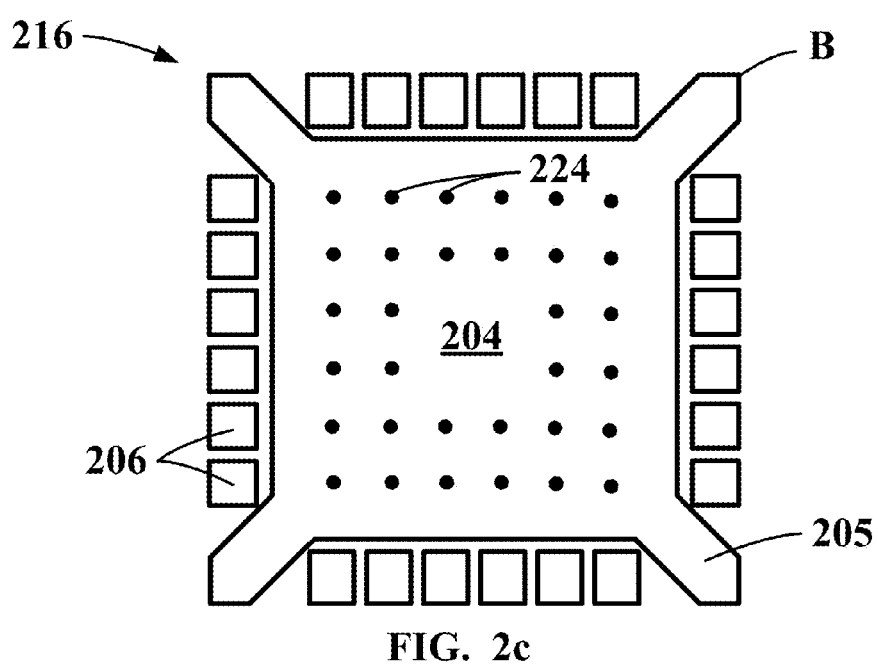
Figure 3:
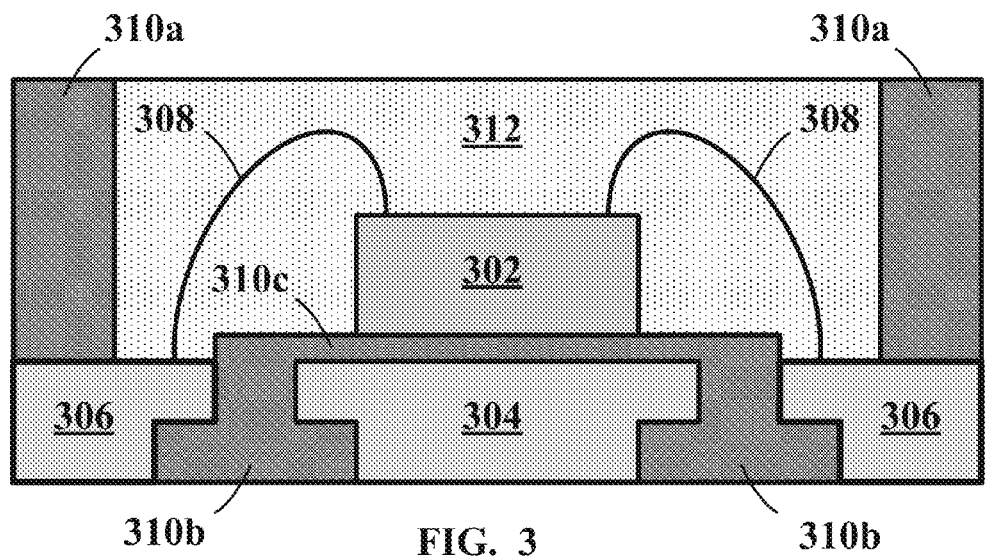
FIG. 3 is a simplified cross-sectional view of a pre-molded IC package in accordance with an embodiment.

FIG. 2c is an enlarged view of the portion B that is outlined by dashed lines in FIG. 3. This is an enlarged view of a single unit 216 and shows the die pad 204 surrounded by the leads 206. The tie bars 205 are more clearly shown in this figure as well. In this example the die pad 204 also includes dimples 224. The dimples 224 on the die pad improve adhesion between any molding compound that may contact the die pad 204. The dimples may be formed at the same time that the dimples are formed on the connecting bars 218a, 218b and/or on portions of the outer frame. In some embodiments, the dimples 224 are included on the connecting bars 218a, 218b and/or portions of the outer frame but not on the die pad 204.

FIGS. 2a-2c show portions of an exemplary leadframe. Embodiments described herein are not limited to any particular leadframe structure. Embodiments may be used with leadframes that include any number and arrangement of units 216, leads 206, die pads 204, tie bars, connecting bars 218a, 218b, and/or other structures or features.

FIG. 3 is a simplified cross-sectional view of a pre-molded IC package in accordance with an embodiment. The pre-molded IC package is this example is similar to that of FIG. 1 and includes a molding compound, die pad, leads, bonding wires, and gel encapsulant. Similar features are included in the example shown in FIG. 1 and have been described previously. Unlike FIG. 1, a portion 310c of the molding compound in this example extends over a top of the die pad 304. The molding compound 310c is secured on each side by portions of the molding compound 310b that extend under the step-like profile along edges of the die pad 304 and leads 306. This strengthens the IC package and helps keep the die pad 304 from becoming dislodged when forces act on a bottom of the die pad 304.

Figure 4A:
FIGS. 4a-4c are simplified cross-sectional views illustrating a method of a forming a pre-molded IC package in accordance with an embodiment.
Figure 4B:
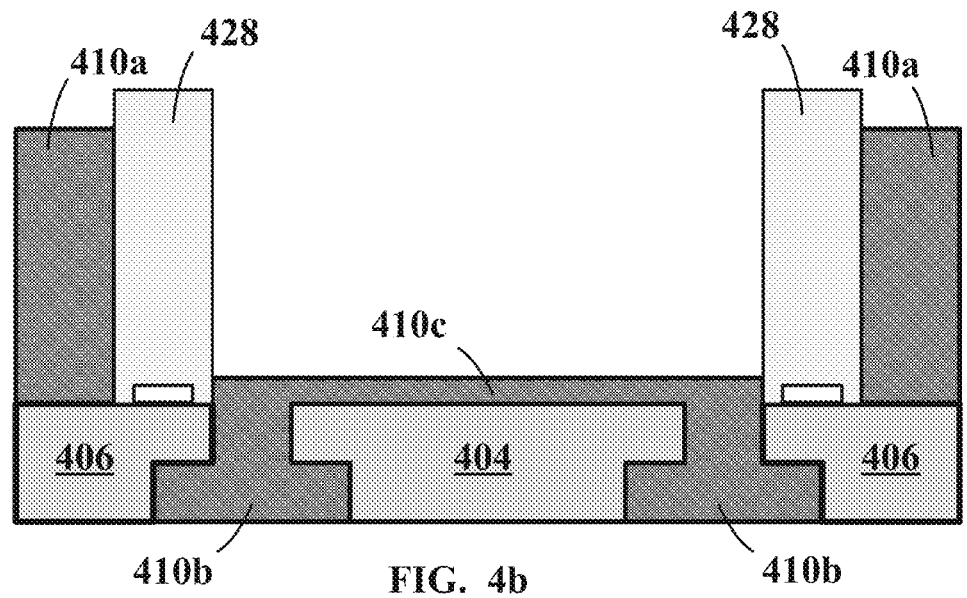
Figure 4C:
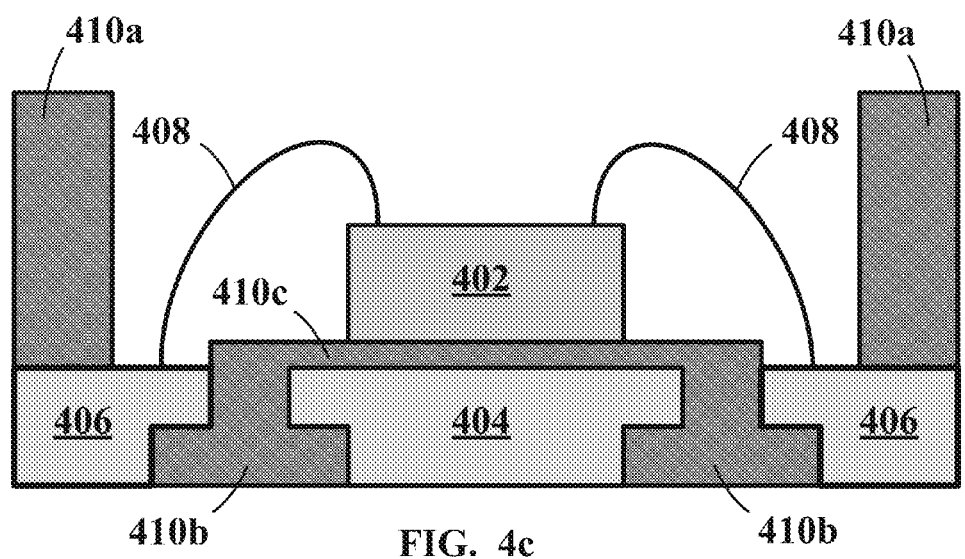

FIGS. 4a-4c are simplified cross-sectional views illustrating a method of a forming a pre-molded IC package in accordance with an embodiment. In FIG. 4a, a die pad 404 and leads 406 are provided. Spaces separate the die pad 404 from the leads 406. Edges of the die pad 404 and the leads 406 include a step-shaped profile in this example. This profile is used to improve adhesion with encapsulant materials (e.g., molding compounds) that may be added during the assembly process. The step-shaped profile may extend along each side of the die pad 404 and one or more sides of the leads 406. This step-shaped profile is used merely as an example, and embodiments described herein are not limited to any particular shape (including a straight edge on the die pad 404 and/or leads 406). Although not shown in this figure, the die pad 404 and leads 406 are typically part of a leadframe that includes a number of similar die pads and leads. The leadframe may be supported by an adhesive tape or ring (not shown) during at least some of the assembly processes. The leadframe (including the outer frame, connecting bars, and die pads) may or may not include dimples like the examples described above with regard to FIGS. 2b-2c.

In FIG. 4b, an insert 428 is placed over the leads 406. In this example, the insert 428 covers portions of the leads 406 closest to the die pad 404 and does not cover portions of the leads 406 farthest from the die pad 404. The insert 428 also does not cover the die pad 404. With the insert 428 covering portions of the leads 406, a molding compound 410a is formed along the outside of the insert 428 to provide a wall or a barrier that forms a cavity over the die pad 404. Spaces between the die pad 404 and leads 406 are filled with the molding compound 410b. A portion 410c of the molding compound is formed over the die pad 404. The portion 410c of the molding compound may extend over the die pad 404 to edges of the die pad 404, or to edges of the leads 406 as shown in this figure. Alternatively, the molding compound 410c may extend to a point in between edges of the die pad 404 and leads 406. A thickness of the molding compound 410c over the die pad 404 may be varied depending on the particular application, but it is generally thinner than the molding compound 410a surrounding the die pad 404. In an embodiment, the molding compound 410a is more than twice as thick as the molding compound 410c.

The molding compound can be formed using any suitable process or material. For example, the pre-molded cavities shown in this example may be formed using conventional molding techniques such as transfer or injection molding processes. In an embodiment, the molding compound may be introduced as a liquid (e.g., semiconductor mold resin or thermoplastic) and flow into the spaces between adjacent leads 406 and the spaces between the leads 406 and the die pad 404. The liquid molding compound may fill the area outside the insert 428 to form the wall or barrier and cover the die pad 404. The liquid molding compound can be cured using known methods (e.g., heating or cooling) to solidify the molding compound.

In FIG. 4c the insert is removed and a semiconductor die 402 is coupled to the molding compound 410c that extends over the die pad 404. The semiconductor die 402 may be attached to the molding compound 410c using a conventional adhesive. Bond pads (not shown) on the top surface of the semiconductor die 402 are bonded to the leads 406 using bonding wires 408. The pre-molded cavity including the semiconductor die 402 and bonding wires 408 may be covered using a gel encapsulant as shown in FIG. 3 (i.e., gel encapsulant 312). In some embodiments, the cavity is only partially filled with the gel encapsulant.

The molding compound may include a conventional injection mold compound such as a Fortron® PPS polymer manufactured by Celanese Corporation. The gel encapsulant may include a conventional encapsulant such as a HIPEC® protective coating manufactured by Dow Corning Corporation.

Note that the insert 428 that is used to form the pre-molded cavity in FIG. 4b has a cutout so that the insert 428 does not contact some portions of the leads 406. The cutout may form a small cavity over each lead 406 that is sealed around the edges so that the molding compound 410 does not enter the cavity. The edges are sealed by portions of the insert 428 that contact the leads 406. The un-contacted portions of the leads 406 remain free from scratches or other damage that may be caused by contact with the insert 428. The leads are typically plated with a metal to improve the bond with the bonding wires 408. Using the insert 428 with cutouts prevents un-contacted portions of the leads 406 from becoming damaged. This allows bonding wires 408 to be reliably attached to the un-contacted portions.

Figure 5:
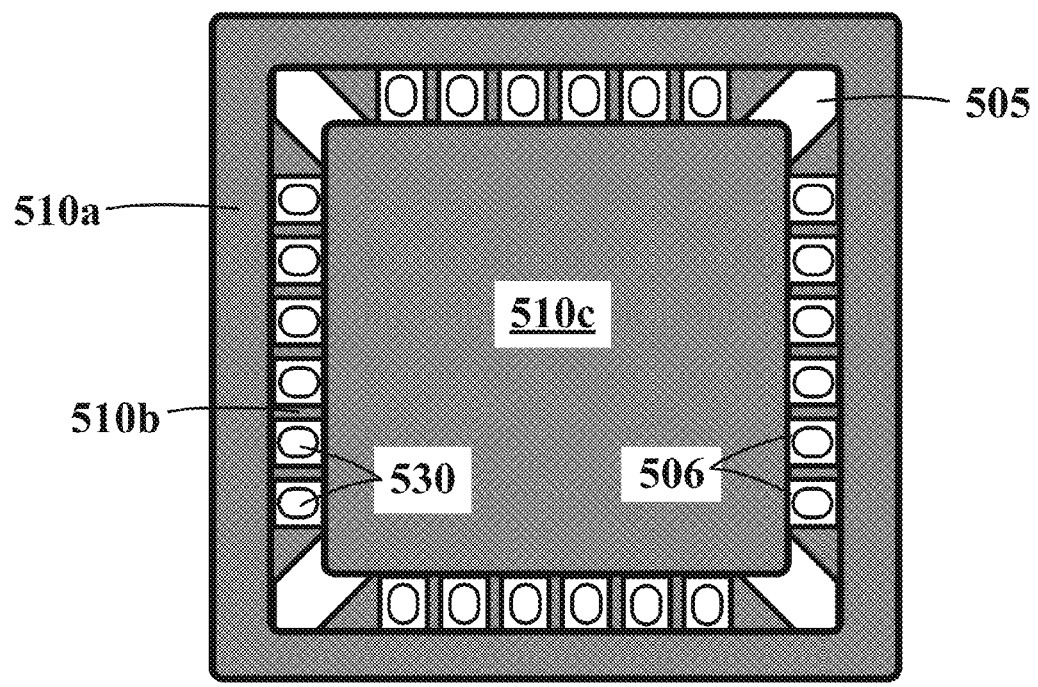
FIG. 5 is a simplified plan view showing portions of the leads that are not contacted during formation of a pre-molded cavity in accordance with an embodiment.
Figure 6:
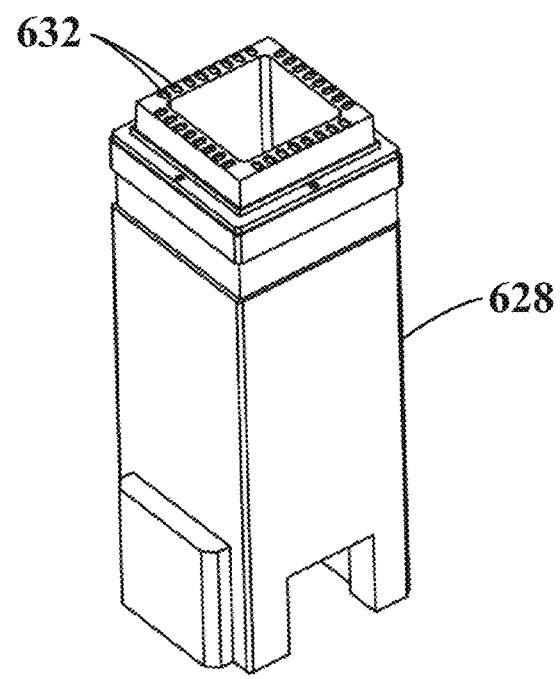
FIG. 6 is a simplified diagram of an insert that can be used to form a pre-molded cavity in accordance with an embodiment.

FIG. 5 is a simplified plan view showing portions of the leads that are not contacted during formation of the pre-molded cavity in accordance with an embodiment. This example includes a pre-molded cavity with the molding compound 510a forming a wall or barrier around the die pad (note that the die pad is covered by the molding compound 510c in this figure), the molding compound 510b filling the spaces between adjacent leads 506 and the spaces between the leads 506 and the die pad, and the molding compound 510c covering the die pad. When the insert is removed, a portion of each of the leads 506 that was covered by the insert is exposed outside the molding compound. In this example, this includes portions of the tie bars 505 and portions of the leads 506. Un-contacted portions 530 of the leads 506 are shown as circular regions centered on the exposed portion of each lead 506. The un-contacted portions 530 are not limited to any particular shape and are sized to provide a sufficient area to form contacts with bonding wires. The size of the un-contacted portions may vary depending on such factors as the particular application of the IC package, capability of wire bonding equipment, specified type of wire bond, and the like. An exemplary insert that can be used to form the un-contacted regions 530 is shown in FIG. 6. The insert 628 includes small cavities 632 that provide the un-contacted regions 530 on each lead 506.

The insert 628 shown in FIG. 6 is for a single unit. As explained previously, packaging processes are generally performed on a number of units that are arranged within an outer frame of a leadframe. Individual inserts may be placed over each unit during the molding process, or an array of inserts that are coupled together may be used that cover the leads of multiple units (or in some embodiments each of the units of the leadframe).

Figure 7:
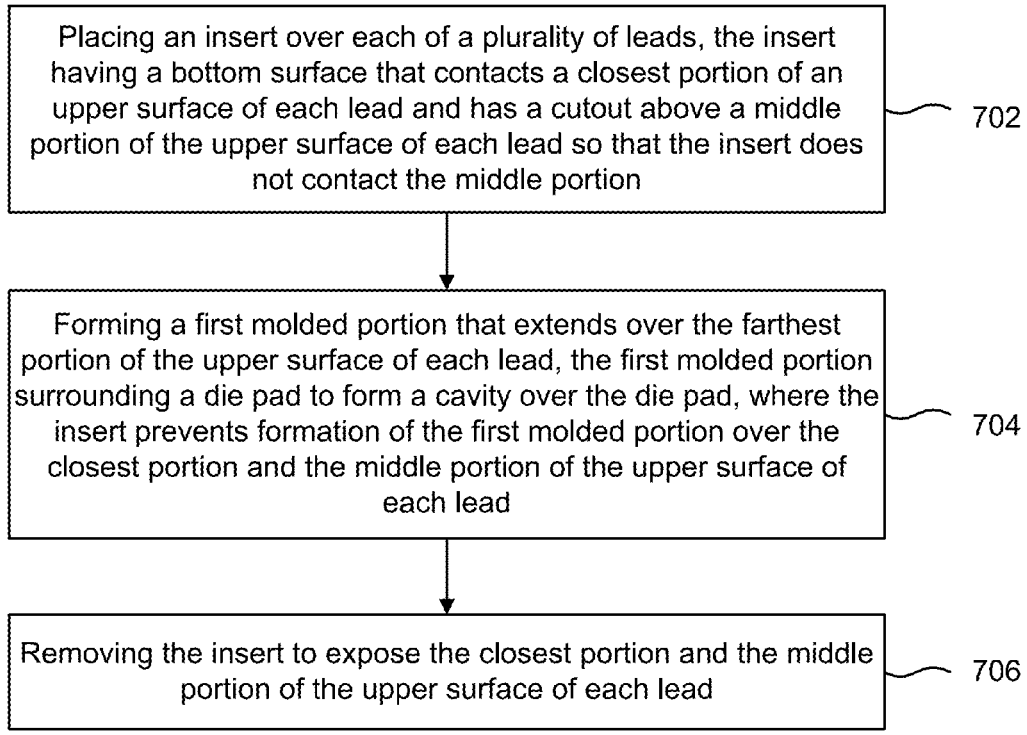
FIG. 7 is a flowchart providing a method of forming a pre-molded cavity in accordance with an embodiment.

FIG. 7 is a flowchart providing a method of forming a pre-molded cavity in accordance with an embodiment. The cavity is formed over a die pad that is surrounded by a plurality of leads. An upper surface of each of the plurality of leads has a closest portion nearest the die pad, a farthest portion farthest from the die pad, and a middle portion between the closest portion and the farthest portion. In an embodiment, the closest and farthest portions of the upper surface surround the middle portion.

The method includes placing an insert over each of a plurality of leads, the insert having a bottom surface that contacts the closest portion of the upper surface of each lead and has a cutout above the middle portion of the upper surface of each lead so that the insert does not contact the middle portion (702).

The method also includes forming a first molded portion that extends over the farthest portion of the upper surface of each lead, the first molded portion surrounding the die pad to form a cavity over the die pad, where the insert prevents formation of the first molded portion over the closest portion and the middle portion of the upper surface of each lead (704).

In some embodiments, the method may also include forming a second molded portion that extends over the die pad, where a thickness of the first molded portion is greater than a thickness of the second molded portion.

In other embodiments, edges of the die pad and edges of the plurality of leads have a step-shaped profile so that an area of the upper surface of the die pad is larger than an area of a lower surface of the die pad and an area of the upper surface of each of the plurality of leads is greater than an area of a lower surface of each of the plurality of leads, and the second molded portion covers the edges of the die pad and the edges of the plurality of leads.

The method also includes removing the insert to expose the closest portion and the middle portion of the upper surface of each lead (706).

In some embodiments, the method also includes placing a semiconductor die in the cavity over the die pad, where the semiconductor die has a plurality of bond pads on an upper surface. A bonding wire is attached from each bond pad to a corresponding lead. The bonding wire is attached to the middle portion of the upper surface of the lead. The semiconductor die is covered and at least a portion of the cavity over the die pad is filled with a gel encapsulant.

In some embodiments, pre-molded cavities may be formed over each die pad of a leadframe using the method outlines in FIG. 7.

It should be appreciated that the specific steps illustrated in FIG. 7 provides a particular method of forming a pre-molded cavity in accordance with an embodiment. Other sequences of steps may also be performed according to alternative embodiments. For example, the steps outlined above may be performed in a different order. Moreover, the individual steps illustrated in FIG. 7 may include multiple sub-steps that may be performed in various sequences as appropriate. Furthermore, additional steps may be added or removed depending on the particular application.

It should be noted that some embodiments of the present invention may be implemented by hardware, software, firmware, middleware, microcode, hardware description languages, or any combination thereof. When implemented in software, firmware, middleware, or microcode, the program code or code segments to perform the necessary tasks may be stored in a computer-readable medium such as a storage medium. Processors may be adapted to perform the necessary tasks. The term "computer-readable medium" includes, but is not limited to, portable or fixed storage devices, optical storage devices, sim cards, other smart cards, and various other mediums capable of storing, containing, or carrying instructions or data.

While the present invention has been described in terms of specific embodiments, it should be apparent to those skilled in the art that the scope of the present invention is not limited to the embodiments described herein. For example, features of one or more embodiments of the invention may be combined with one or more features of other embodiments without departing from the scope of the invention. The specification and drawings are, accordingly, to be regarded in an illustrative rather than a restrictive sense. Thus, the scope of the present invention should be determined not with reference to the above description but with reference to the appended claims along with their full scope of equivalents.

What is claimed is:

1. A leadframe with pre-molded cavities for use in making integrated circuit packages, the leadframe comprising:
   an outer frame; and
   a plurality of units arranged within the outer frame, each unit of the plurality of units comprising a die pad and a plurality of leads, the die pad located near a center of the unit and the plurality of leads located around the die pad, wherein for each unit of the plurality of units a molding compound extends over:
      a first portion of an upper surface of each of the plurality of leads that is located farthest from the die pad, and
      an entire upper surface of the die pad, wherein a second portion of the upper surface of each of the plurality of leads that is located nearest the die pad remains exposed outside the molding compound, an upper surface of the molding compound that extends over the entire upper surface of the die pad extends upward beyond the upper surface of the plurality of leads and is entirely exposed, and a thickness of the molding compound covering the first portion of the upper surface of each of the plurality of leads is greater than a thickness of the molding compound covering the entire upper surface of the die pad.

2. The leadframe of claim 1 wherein for each unit of the plurality of units, edges of the die pad and edges of the plurality of leads have a step-shaped profile so that an area of the entire upper surface of the die pad is larger than an area of a lower surface of the die pad and an area of the upper surface of each of the plurality of leads is greater than an area of a lower surface of each of the plurality of leads, and the molding compound covers the edges of the die pad and the edges of the plurality of leads.

3. The leadframe of claim 1 wherein for each unit of the plurality of units the molding compound covers edges of the die pad and edges of the plurality of leads.

4. The leadframe of claim 1 wherein the thickness of the molding compound extending over the first portion of the upper surface of each of the plurality of leads is more than twice the thickness of the molding compound extending over the entire upper surface of die pad.

5. The leadframe of claim 1 wherein the molding compound extending over the first portion of the upper surface of each of the plurality of leads surrounds the die pad to form a cavity over the die pad and the second portion of the upper surface of each of the plurality of leads.

6. The leadframe of claim 1 further comprising a plurality of connecting bars, wherein each connecting bar separates a unit of the plurality of units from an adjacent unit, and the molding compound extends over each of the plurality of connecting bars.

7. A leadframe for use in making integrated circuit packages, the leadframe comprising:
   an outer frame;
   a plurality of units arranged within the outer frame, each unit of the plurality of units comprising a single die pad and a plurality of leads, the die pad located near a center of the unit and the plurality of leads located around the die pad; and
   a plurality of connecting bars, each connecting bar of the plurality of connecting bars being directly connected to a portion of the plurality of leads of a unit of the plurality of units and directly connected to a portion of the plurality of leads of an immediately adjacent unit, each connecting bar of the plurality of connecting bars comprising a substantially planar upper surface with a plurality of dimples extending into the connecting bar from the substantially planar upper surface to a depth less than a thickness of the connecting bar, wherein for each connecting bar of the plurality of connecting bars, the dimples are arranged in a regular periodic pattern along a middle of the connecting bar, each dimple has a substantially circular shape and is spaced from adjacent ones of the plurality of dimples by portions of the substantially planar upper surface that are free from dimples, and each dimple is spaced from each edge of the connecting bar by an area on the substantially planar upper surface that is free from dimples, each area extending linearly along an entire length of the connecting bar.

8. The leadframe of claim 7 wherein the outer frame comprises an upper surface with a plurality of dimples extending from the upper surface to a depth less than a thickness of the outer frame, each dimple spaced from an adjacent dimple and from an edge of the outer frame by portions of the upper surface.

9. The leadframe of claim 7 wherein the plurality of units are arranged in columns and rows within the outer frame.

10. The leadframe of claim 7 wherein the plurality of units are arranged side-by-side within the outer frame, where every two adjacent units of the plurality of units are separated by one of the plurality of connecting bars, and each unit of the plurality of units is coupled to the outer frame along ends of the unit.

* * * * *